US012812940B2

(12) United States Patent
Kato et al.

(10) Patent No.: US 12,812,940 B2
(45) Date of Patent: Nov. 24, 2026

(54) SEMICONDUCTOR DEVICE

(71) Applicant: FUJI ELECTRIC CO., LTD., Kanagawa (JP)

(72) Inventors: Yoshiharu Kato, Matsumoto-city (JP); Toru Ajiki, Matsumoto-city (JP); Tohru Shirakawa, Matsumoto-city (JP); Misaki Takahashi, Matsumoto-city (JP); Kaname Mitsuzuka, Matsumoto-city (JP); Takashi Yoshimura, Matsumoto-city (JP); Yuichi Onozawa, Matsumoto-city (JP); Hiroshi Takishita, Matsumoto-city (JP); Soichi Yoshida, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 236 days.

(21) Appl. No.: 18/742,974

(22) Filed: Jun. 13, 2024

(65) Prior Publication Data

US 2024/0332373 A1 Oct. 3, 2024

Related U.S. Application Data

(63) Continuation of application No. 18/333,562, filed on Jun. 13, 2023, now Pat. No. 12,015,058, which is a (Continued)

(30) Foreign Application Priority Data

Nov. 16, 2018 (JP) ................................ 2018-215549
Nov. 8, 2019 (JP) ................................ 2019-203105

(51) Int. Cl.
*H10D 62/60* (2025.01)
*H10D 62/10* (2025.01)
(Continued)

(52) U.S. Cl.
CPC ........... *H10D 62/60* (2025.01); *H10D 62/105* (2025.01); *H10D 62/393* (2025.01); *H10P 30/20* (2026.01)

(58) Field of Classification Search
CPC .... H10D 62/60; H10D 62/105; H10D 62/141; H10D 62/393; H10D 12/038;
(Continued)

(56) References Cited

U.S. PATENT DOCUMENTS

2002/0190281 A1 12/2002 Francis
2004/0041225 A1 3/2004 Nemoto
(Continued)

FOREIGN PATENT DOCUMENTS

CN 104903997 A 9/2015
JP 2008211148 A 9/2008
(Continued)

OTHER PUBLICATIONS

International Search Report and (ISA/237) Written Opinion of the International Search Authority for International Patent Application No. PCT/JP2019/044756, mailed by the Japan Patent Office on Feb. 18, 2020.
(Continued)

*Primary Examiner* — Fazli Erdem

(57) ABSTRACT

A semiconductor device includes a semiconductor substrate with an upper surface and a lower surface, including an n-type semiconductor region having a hydrogen containing region. A carrier concentration distribution representing a carrier concentration by a semi-logarithmic graph in the depth direction of the n-type semiconductor region includes a flat portion containing a first flat part and a second flat part located closer to the lower surface of the semiconductor substrate than the first plat part, and a slope located between the first flat part and the second flat part.

19 Claims, 11 Drawing Sheets

Related U.S. Application Data continuation of application No. 17/078,042, filed on Oct. 22, 2020, now Pat. No. 11,715,771, which is a continuation of application No. PCT/JP2019/044756, filed on Nov. 14, 2019.

(51) Int. Cl.
*H10D 62/17* (2025.01)
*H10P 30/20* (2026.01)

(58) Field of Classification Search
CPC ..... H10D 12/481; H10P 30/20; H10P 30/204; H10P 30/208; H10P 95/90
See application file for complete search history.

(56) References Cited

U.S. PATENT DOCUMENTS

| | | | | |
|---|---|---|---|---|
| 2007/0231973 | A1 | 10/2007 | Ruething | |
| 2008/0054369 | A1 | 3/2008 | Schulze | |
| 2013/0249058 | A1 | 9/2013 | Neidhart | |
| 2014/0217463 | A1 | 8/2014 | Schulze | |
| 2015/0179441 | A1 * | 6/2015 | Onozawa | H10D 62/60 257/109 |
| 2015/0270132 | A1 | 9/2015 | Laven | |
| 2015/0311279 | A1 | 10/2015 | Onozawa | |
| 2015/0357229 | A1 | 12/2015 | Schulze | |
| 2015/0371858 | A1 | 12/2015 | Laven | |
| 2016/0141399 | A1 | 5/2016 | Jelinek | |
| 2016/0172438 | A1 | 6/2016 | Jelinek | |
| 2016/0276446 | A1 | 9/2016 | Wakimoto | |
| 2016/0276470 | A1 | 9/2016 | Aida | |
| 2016/0329401 | A1 | 11/2016 | Laven | |
| 2016/0372541 | A1 | 12/2016 | Onozawa | |
| 2017/0005163 | A1 | 1/2017 | Schwagmann | |
| 2017/0271447 | A1 | 9/2017 | Tamura | |
| 2018/0005829 | A1 | 1/2018 | Takishita | |
| 2018/0012762 | A1 | 1/2018 | Mukai | |
| 2018/0040691 | A1 | 2/2018 | Breymesser | |
| 2018/0166279 | A1 | 6/2018 | Tamura | |
| 2020/0194562 | A1 | 6/2020 | Yoshimura | |

FOREIGN PATENT DOCUMENTS

| | | | |
|---|---|---|---|
| JP | 2015095559 | A | 5/2015 |
| WO | 0186712 | A1 | 11/2001 |
| WO | 2016051973 | A1 | 4/2016 |
| WO | 2017047285 | A1 | 3/2017 |
| WO | 2017146148 | A1 | 8/2017 |

OTHER PUBLICATIONS

Office Action issued for related Chinese Application 201980028584.4, issued by the State Intellectual Property Office of People's Republic of China on Dec. 21, 2023.

Office Action issued for related Chinese Application 201980028584.4, issued by the State Intellectual Property Office of People's Republic of China on May 8, 2024.

U.S. Patent Application Publications 1-21, Foreign Patent Documents 2-6, and Non-Patent Literature Documents 1-2 were submitted as IDS or found by the examiner over the earlier U.S. Appl. No. 18/333,562, filed Jun. 13, 2023, and U.S. Appl. No. 17/078,042, filed Oct. 22, 2020.

* cited by examiner

SEMICONDUCTOR DEVICE

CROSS-REFERENCE TO RELATED APPLICATIONS

This application is a continuation application of U.S. patent application Ser. No. 18/333,562, filed on Jun. 13, 2023, which is a continuation application of U.S. patent application Ser. No. 17/078,042, filed on Oct. 22, 2020, which is a continuation of International Application No. PCT/JP2019/044756, filed in WO on Nov. 14, 2019, which claims priority to Japanese Patent Application No. 2018-215549 filed in JP on Nov. 16, 2018, and Japanese Patent Application NO. 2019-203105 filed in JP on Nov. 8, 2019, the contents of each of which are hereby incorporated herein by reference in their entirety.

BACKGROUND

1. Technical Field

The present invention relates to a semiconductor device and a manufacturing method thereof.

2. Related Art

Conventionally, a technique of forming an N type region by implanting hydrogen in a semiconductor substrate has been known (see, for example, Patent Document 1). Patent Document 1: US 2016/141399

Technical Problem

Preferably, a carrier concentration distribution in an N type region can be adjusted as appropriate.

[General Disclosure]

In order to solve the issue described above, according to one aspect of the present invention, a semiconductor device comprising a semiconductor substrate is provided. The semiconductor substrate may include a hydrogen containing region including hydrogen. The hydrogen containing region may include a high concentration region with a higher carrier concentration than a virtual carrier concentration determined based on a concentration of hydrogen included and an activation ratio of hydrogen.

The carrier concentration in the high concentration region may be higher than a base doping concentration in the semiconductor substrate.

The carrier concentration distribution in a depth direction of the hydrogen containing region may have a first peak.

A carrier concentration distribution in the depth direction of the hydrogen containing region may have a plurality of first peaks. The high concentration region may be arranged between the first peaks in the depth direction.

The high concentration region may be arranged between the deepest first peak and the second deepest first peak among the first peaks.

A carrier concentration distribution of the high concentration region may have a second peak in the depth direction.

The second peak in the high concentration region may have a width greater than the width of any of the first peaks.

A hydrogen chemical concentration distribution in the hydrogen containing region may have a plurality of fifth peaks. A full width at half maximum of the second peak may be greater than a half of a fifth peak interval between the deepest fifth peak and the second deepest fifth peak of the fifth peaks.

The deepest fifth peak and the second deepest fifth peak of the fifth peaks may be included in a range of the full width at half maximum of the second peak.

The hydrogen containing region may include a lifetime control region including an adjustment impurity for adjusting a lifetime of a carrier. A concentration distribution of the adjustment impurity in the depth direction may have a third peak. The high concentration region may be provided at a position deeper than the third peak in the concentration distribution of the adjustment impurity.

A full width at half maximum of the third peak may be greater than an interval between the plurality of first peaks in the depth direction.

An oxygen concentration in the high concentration region may be $1\times10^{17}/cm^3$ or more.

A carbon concentration in the high concentration region may be $1\times10^{13}/cm^3$ or more.

The semiconductor substrate may include an N type drift region. The semiconductor substrate may include an N type emitter region that is provided to be in contact with an upper surface of the semiconductor substrate and has a higher carrier concentration than that in the drift region. The semiconductor substrate may include a P type base region provided between the emitter region and the drift region. The semiconductor substrate may include a P type collector region provided to be in contact with a lower surface of the semiconductor substrate. The semiconductor substrate may include an N type buffer region that is provided between the collector region and the drift region, and has a higher carrier concentration than that in the drift region. The hydrogen containing region may be included in the buffer region.

According to a second aspect of the present invention, a method of manufacturing a semiconductor device comprising a semiconductor substrate is provided. The manufacturing method may include implanting hydrogen in the semiconductor substrate to form a hydrogen containing region. The manufacturing method may, in the hydrogen containing region, include forming a lifetime control region for adjusting a lifetime of a carrier. The manufacturing method may include performing thermal treatment on the semiconductor substrate to form, in the hydrogen containing region, a high concentration region with a higher carrier concentration than a virtual carrier concentration determined based on a concentration of impurities included and an activation ratio of the impurities.

The summary clause of the invention described above does not necessarily describe all necessary features of the embodiments of the present invention. The present invention may also be a sub-combination of the features described above.

DESCRIPTION OF EXEMPLARY EMBODIMENTS

Figure 1:
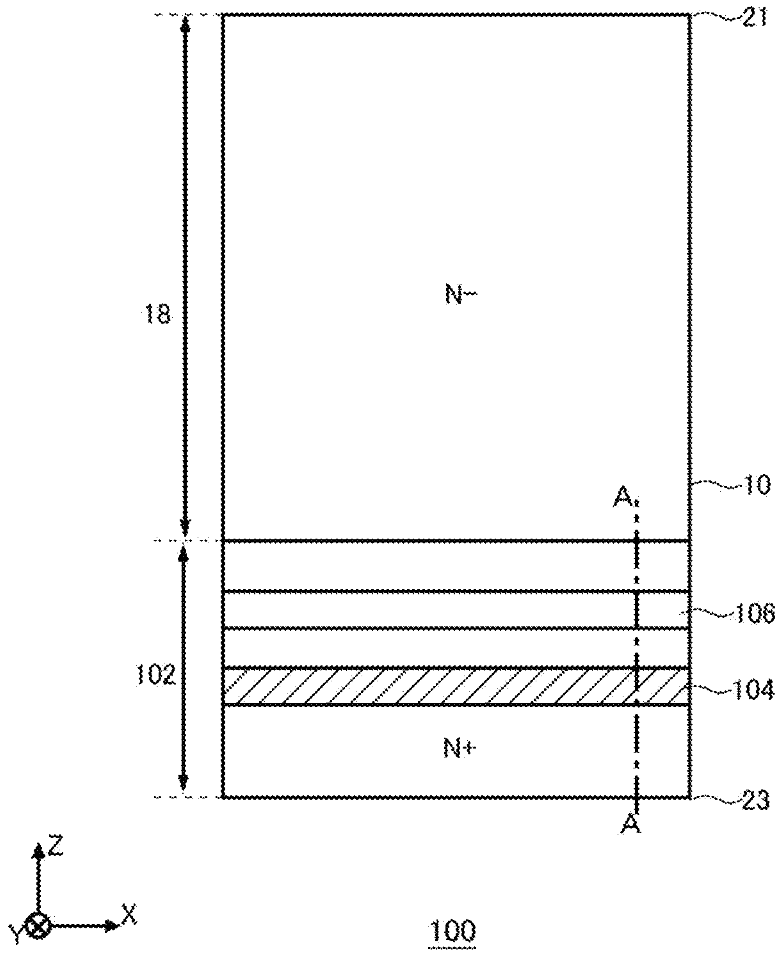
FIG. 1 is a cross-sectional view of an example of a semiconductor device 100.

Hereinafter, the present invention will be described through embodiments of the invention, but the following embodiments are not intended to limit the invention of the claims. Also, all combinations of features described in the embodiments are not necessarily essential to solutions of the invention.

As used herein, one side in a direction parallel to the depth direction of a semiconductor substrate is referred to as "upper" and the other side is referred to as "lower". Of two main surfaces of a substrate, a layer, or other members, one surface is referred to as an upper surface, and the other surface is referred to as a lower surface. An "upper" and "lower" direction is not limited to the direction of gravity, or a direction in which the semiconductor device is mounted.

As used herein, in some cases, technical matters may be described using orthogonal coordinate axes of X axis, Y axis, and Z axis. The orthogonal coordinate axes are intended to merely specify relative positions of components and are not intended to limit to a specific direction. For example, the Z axis is not intended to be limited to indicate a height direction with respect to the ground. Note that a +Z axis direction and a −Z axis direction are directions opposite to each other. In a case where the Z axis direction is described without a description of positive and negative signs, the direction means a direction parallel to the +Z axis and the −Z axis.

Axes that are orthogonal to each other and in parallel with an upper surface and a lower surface of the semiconductor substrate are the X axis and the Y axis herein. In addition, an axis that is perpendicular to the upper surface and the lower surface of the semiconductor substrate is the Z axis. The direction of the Z axis may be referred to as a depth direction herein. In addition, a direction in parallel with the upper surface and the lower surface of the semiconductor substrate, including the X axis and the Y axis, may be referred to as a horizontal direction herein.

As used herein, referring to "same" or "equal" may include an error due to variations in manufacturing or the like. The error is, for example, within 10%.

In the specification, a conductivity type of doping region where doping has been carried out with an impurity is described as a P type or an N type. As used herein, impurities may particularly mean either of an N type donor or a P type acceptor, and may be referred to as a dopant. As used herein, doping means introducing a donor or an acceptor into a semiconductor substrate to obtain semiconductor of N type conductivity or a semiconductor of P type conductivity.

As used herein, a doping concentration means a concentration of a donor or a concentration of an acceptor at a thermal equilibrium state. In the present specification, a net doping concentration means a net concentration obtained by adding the donor concentration as positive ions to the acceptor concentration as negative ions, including the polarities of charges. As an example, when the donor concentration is ND, and the acceptor concentration is NA, the net doping concentration at an arbitrary position becomes ND-NA. As used herein, the net doping concentration may be simply referred to as a doping concentration.

The donor has a function of supplying electrons to the semiconductor. The acceptor has a function of receiving electrons from the semiconductor. The donor and the acceptor are not limited to impurities themselves. For example, a VOH defect, as a result of bonding of a vacancy (V), oxygen (O), and hydrogen (H) present in a semiconductor, functions as a donor for supplying an electron. As used herein, the VOH defect may be referred to as a hydrogen donor.

As used herein, P+ type or N+ type indicates a higher doping concentration than P type or N type, and P− type or N− type indicates a lower doping concentration than P type or N type. In addition, as used herein, P++ type or N++ type indicates a higher doping concentration than P+ type or N+ type.

As used herein, a chemical concentration refers to an impurity concentration measured regardless of an electrically activated state. The chemical concentration can be measured by, for example, Secondary Ion Mass Spectrometry (SIMS) method. The above-mentioned net doping concentration can be measured by Voltage-Capacity measurement method (CV method). Also, a carrier concentration measured by Spread Resistance (SR) measurement method may be the net doping concentration. The carrier concentration measured by the CV method or SR method may be a value in a thermal equilibrium state. In addition, since the donor concentration is sufficiently larger than the acceptor concentration in the N type region, the carrier concentration in the region may be used as the donor concentration. Similarly, in the P type region, the carrier concentration in the region may be used as the acceptor concentration. As used herein, the doping concentration in an N type region may be referred to as a donor concentration, and the doping concentration in a P type region may be referred to as an acceptor concentration.

In addition, in a case where a concentration distribution of a donor, an acceptor, or net doping has a peak, the peak value may be the concentration of the donor, the acceptor, or the net doping in the region. For example, when the concentration of the donor, the acceptor, or the net doping is approximately uniform, an average value of the concentration of the donor, the acceptor, or the net doping in the region may be the concentration of the donor, the acceptor, or net doping.

The carrier concentration measured by SR method may be lower than the concentration of the donor or the acceptor. In a range where the current flows when measuring a spreading resistance, there is a case where the carrier mobility of the semiconductor substrate is lower than the value of the crystal state. The decrease in carrier mobility occurs by a carrier scatter due to disorder of the crystal structure caused by a lattice defect or the like.

The donor or acceptor concentration calculated from the carrier concentration measured by the CV method or SR method may be lower than the chemical concentration of an element serving as a donor or acceptor. As one example, the donor concentration of phosphorous or arsenic serving as the donor or the acceptor concentration of boron serving as the acceptor in a silicon semiconductor is about 99% of these chemical concentrations. On the other hand, the donor concentration of hydrogen as a donor in the silicon semiconductor is about 0.1% to 10% of the chemical concentration of hydrogen. SI unit system is used herein. The unit of a distance or length may be represented in cm (centimeters) herein. In this case, calculations may be done after it is converted to m (meters). As one example, when a term concentration is simply used herein, it means a concentration per unit volume (/$cm^3$). For example, the chemical concentration of impurities is the number of atoms of the impurities included per unit volume (atoms/$cm^3$).

FIG. 1 is a cross-sectional view of an example of a semiconductor device 100. The semiconductor device 100 is provided with a transistor component, such as an insulated gate bipolar transistor (IGBT) and a diode component such as a freewheeling diode (FWD), but the details of the structures of these components are omitted in FIG. 1.

The semiconductor device 100 comprises a semiconductor substrate 10. The semiconductor substrate 10 is a substrate made of a semiconductor material. As one example, the semiconductor substrate 10 is a silicon substrate. The semiconductor substrate 10 includes impurities intentionally or unintentionally added at the time of manufacturing of a semiconductor ingot. The semiconductor substrate 10 has a doping concentration determined by impurities and the like implanted at the time of manufacturing. In this example, a conductivity type of the semiconductor substrate 10 is N− type. In some cases, the doping concentration in the semiconductor substrate 10 may be referred to as a base doping concentration Db.

As one example, when the semiconductor ingot is silicon, impurities for determining the base doping concentration Db include N type impurities (dopant) such as phosphorous, antimony, and arsenic, and P type impurities (dopant) such as boron and aluminum. The base doping concentration Db may be lower than the chemical concentration of the dopant of the semiconductor ingot. In one example where the dopant is phosphorous or boron, the base doping concentration Db may be 50% or more or 90% or more of the chemical concentration of the dopant. In another example where the dopant is antimony, the base doping concentration Db may be 5% or more, 10% or more, or 50% or more of the chemical concentration of the dopant. In addition, the semiconductor substrate 10 may include carbon and oxygen. The carbon and the oxygen may be distributed over the entirety of the semiconductor substrate 10. An example of a method of manufacturing semiconductor ingots is Magnetic field applied Czochralski (MCZ) method, but other methods may be employed. The other methods include Czochralski (CZ) method and Floating Zone (FZ) method.

The semiconductor substrate 10 comprises an upper surface 21 and a lower surface 23. The upper surface 21 and the lower surface 23 are two main surfaces of the semiconductor substrate 10. Axes that are orthogonal to each other in a plane parallel to the upper surface 21 and the lower surface 23 are the X axis and the Y axis, and an axis that is perpendicular to the upper surface 21 and the lower surface 23 is the Z axis herein.

The semiconductor substrate 10 includes a hydrogen containing region 102 including hydrogen. In this example, hydrogen ions are implanted to the hydrogen containing region 102 from the lower surface 23 side of the semiconductor substrate 10. In this example, the hydrogen ions are protons. The hydrogen ions may be deuterons or tritons. The hydrogen containing region 102 is a region where the chemical concentration of hydrogen is higher than the chemical concentration of any of the other N type impurities and P type impurities. In the hydrogen containing region 102, the chemical concentration of hydrogen may be equal to or greater than 100 times the chemical concentration of the impurities with the highest chemical concentration among the other N type impurities and P type impurities. The hydrogen containing region 102 may be a region where the chemical concentration of hydrogen is equal to or greater than 10 times the base doping concentration Db. The hydrogen containing region 102 may be a region where the chemical concentration of hydrogen is higher than the base doping concentration Db. The hydrogen containing region 102 may include impurities such as helium that do not function as N type impurities or P type impurities. The chemical concentration of the impurities such as helium in the hydrogen containing region 102 may be higher than the chemical concentration of hydrogen. The impurities such as helium may function as an adjustment impurity for adjusting the lifetime of the carrier of the semiconductor substrate 10.

The hydrogen ions implanted from the lower surface 23 of the semiconductor substrate 10 pass through the inside of the semiconductor substrate 10 to the depth corresponding to the acceleration energy. In the region where the hydrogen ions have passed through, vacancy defects such as a vacancy (V) and a divacancy (VV) are formed. As used herein, a vacancy shall include a divacancy unless otherwise stated. The vacancy defect may include dangling bonds in the vacancy or the divacancy, and may include unpaired electrons of the dangling bonds. When thermal treatment is performed on the semiconductor substrate 10 after the hydrogen ion implantation, hydrogen is diffused. The diffused hydrogen bonds with the vacancy (V) and oxygen (O) to form VOH defects. The VOH defects functions as a donor for supplying electrons. In addition, the diffused hydrogen itself functions as a hydrogen donor by being activated. Thus, the hydrogen containing region 102 becomes an N+ type region with a higher concentration than the base doping concentration Db.

As used herein, a ratio of the concentration of the dopant (donor or acceptor) produced by impurities, to the chemical concentration of the impurities will be referred to as an activation ratio of the impurities. The dopant produced by impurities is a VOH defect and a hydrogen donor in a case of hydrogen. In cases of other P type impurities and N type impurities, the dopant produced by impurities is the dopant as a result of the activation of the impurities themselves. Generally, the doping concentration in the semiconductor substrate 10 is obtained by multiplying the concentration of the included impurities by the activation ratio of the impurities. For example, when hydrogen is substantially the only impurity included in the hydrogen containing region 102, the doping concentration in the hydrogen containing region 102 is expected to be a value obtained by multiplying the chemical concentration of hydrogen by the activation ratio of hydrogen. The activation ratio of hydrogen may be about 0.1% to 80%, for example, about 1%. As used herein, a concentration obtained by multiplying the chemical concentration of the impurities by the activation ratio of impurities is referred to as virtual carrier concentration (or virtual doping concentration). The virtual carrier concentration is determined for each position of the semiconductor substrate 10, based on the chemical concentration and activation ratio of impurities.

The hydrogen containing region 102 includes a high concentration region 106. The high concentration region 106 is a region with a carrier concentration higher than the above-mentioned virtual carrier concentration. Alternatively, the high concentration region 106 is a region with a doping concentration higher than the above-mentioned virtual doping concentration. As used herein, the description is given using the carrier concentration and the virtual carrier concentration, but the carrier concentration and the virtual carrier concentration can be read as the doping concentration and the virtual doping concentration as appropriate. As one example, the high concentration region 106 can be formed by adjusting the distribution of vacancy defects in the hydrogen containing region 102. The vacancy defects are expected to be uniformly distributed over the entirety of the substrate, at the time of manufacturing of the semiconductor substrate 10. When hydrogen is implanted in the hydrogen containing region 102, the vacancy defects are distributed according to the distribution of the implanted hydrogen. When thermal treatment is performed after the hydrogen implantation, the hydrogen donor or VOH defects are formed, and the carrier concentration distribution corresponding to the hydrogen distribution is obtained. When the thermal treatment is performed with new vacancy defects produced in the hydrogen containing region 102 in addition to the vacancy defects formed by the hydrogen implantation, hydrogen in the hydrogen containing region 102 bonds with the new vacancy defects, whereby a new hydrogen donor or VOH defects are formed. With these new VOH defects, the high concentration region 106 is formed. The new vacancy defects can be formed by implanting an adjustment impurity, such as helium for example, not functioning as a dopant, in the hydrogen containing region 102. As used herein, the term "VOH defect" is used as a concept including a hydrogen donor or a donor newly formed by hydrogen ion implantation, unless noted otherwise.

The hydrogen containing region 102 of this example includes a lifetime control region 104. The lifetime control region 104 is a region having the lifetime of the carrier being reduced, due to a lifetime killer for adjusting the lifetime of the carrier being formed. The lifetime killer is a carrier recombination center, which may be a crystal defect, and may be a vacancy defect such as a vacancy or a divacancy, a defect complex being formed due to the above-mentioned defects being combined with impurities of an element constituting the semiconductor substrate 10 or other than the element, a dislocation, a rare gas element such as helium, neon, or argon, and a metal element such as platinum. In this example, the vacancy defects and the like, produced by the implantation of the adjustment impurity such as helium in the semiconductor substrate 10, function as the lifetime killer.

As described above, the vacancy defects may be bonded with hydrogen to be the VOH defects, as a result of the thermal treatment. When many vacancy defects are formed, a rate of vacancy defects remaining without being bonded with hydrogen increases, due to an insufficient amount of hydrogen. A region where many vacancy defects exist involves a reduction in the carrier lifetime, and thus serves as the lifetime control region 104. Meanwhile, the vacancy defects are formed by irradiation with the adjustment impurity such as helium, with the number of vacancy defects being large in the vicinity of the range of the adjustment impurity, and smaller at a position farther than the range of the adjustment impurity. Thus, in a region apart from the range of the adjustment impurity, a sufficient amount of hydrogen exists for vacancy defects, whereby a rate of vacancy defects bonding with hydrogen to be VOH defects increases. A region where many VOH defects are formed functions as the high concentration region 106.

In this example, the lifetime control region 104 is formed by implanting the adjustment impurity from the lower surface 23 side of the semiconductor substrate 10. The high concentration region 106 may be provided at a position apart from the lifetime control region 104 in a depth direction (Z-axis direction). The high concentration region 106 of this example is provided at a position deeper than the lifetime control region 104 relative to the lower surface 23.

When the adjustment impurity is implanted in a range near the lifetime control region 104 from the lower surface 23 side, a relatively large number of vacancy defects and the like are formed in a region where the adjustment impurity has passed, whereas the number of vacancy defects formed is relatively small in a region deeper than the range. Thus, in a region deeper than the range, the rate of vacancy defects formed and becoming VOH defects is high, whereby formation of the high concentration region 106 is facilitated. Note that the relationship between the lifetime control region 104 and the high concentration region 106 is not limit to this. The high concentration region 106 may be formed at a position shallower than the lifetime control region 104.

In addition, the high concentration region 106 can be formed without providing the lifetime control region 104. For example, by implanting an adjustment impurity with a relatively low concentration near the high concentration region 106, a relatively small number of vacancy defects can be formed as compared with hydrogen in the region. Thus, the rate of the vacancy defects becoming VOH defects is increased, whereby the high concentration region 106 can be formed without reducing the lifetime. In this case, the high concentration region 106 can be provided at an arbitrary position without being limited by the position of the lifetime control region 104.

Note that the difference between the carrier concentration and the virtual carrier concentration in the high concentration region 106 has been confirmed to increase with the chemical concentration of carbon in the high concentration region 106 through experiments. Thus, the chemical concentration of carbon in the high concentration region 106 is preferably $1\times10^{13}/cm^3$ or more. The chemical concentration of carbon in the high concentration region 106 may be $1\times10^{14}/cm^3$ or more and may be $1\times10^{15}/cm^3$ or more. In addition, the chemical concentration of carbon in the high concentration region 106 may be $1\times10^{16}/cm^3$ or less, $5\times10^{15}/cm^3$ or less, and may be $1\times10^{15}/cm^3$ or less. The semiconductor substrate 10 may have the above-mentioned carbon concentration over its entirety.

In addition, the formation of the VOH defects is facilitated by a higher oxygen concentration. The chemical concentration of oxygen in the high concentration region 106 may be $1\times10^{17}/cm^3$ or more. The chemical concentration of oxygen in the high concentration region 106 may be $5\times10^{17}/cm^3$ or more and may be $1\times10^{18}/cm^3$ or more. In addition, the chemical concentration of oxygen in the high concentration region 106 may be $1\times10^{19}/cm^3$ or less, $5\times10^{18}/cm^3$ or less, and may be $1\times10^{18}/cm^3$ or less. The semiconductor substrate 10 may have the above-mentioned oxygen concentration over its entirety.

By manufacturing the semiconductor substrate 10 using the MCZ method, the above-mentioned carbon concentration and oxygen concentration can be easily achieved. Still, the semiconductor substrate 10 may not be limited to an MCZ substrate manufactured by using the MCZ method.

The semiconductor substrate 10 may be provided with a drift region 18. The drift region 18 is an N− type region with a lower doping concentration than that in the hydrogen containing region 102. The doping concentration in the drift region 18 may be the same as the base doping concentration Db. The drift region 18 may include a region with the doping concentration higher than the base doping concentration Db. The doping concentration distribution of the drift region 18 may be approximately uniform or flat in a predetermined depth range L0. The expression "uniform or flat" indicates a distribution in which, in the predetermined depth range L0, a change of the doping concentration indicates a range of values that are 80% or more and 120% or less of the base doping concentration Db, for example. The predetermined depth range L0 may be a length within 10% of a thickness W of the semiconductor substrate 10 (thus, L0≤0.1 W0), a length within 30% thereof (thus, L0≤0.3 W0), a length within 50% thereof (thus, L0≤0.5 W0), or a length within 70% thereof (thus, L0≤0.7 W0).

Figure 2:
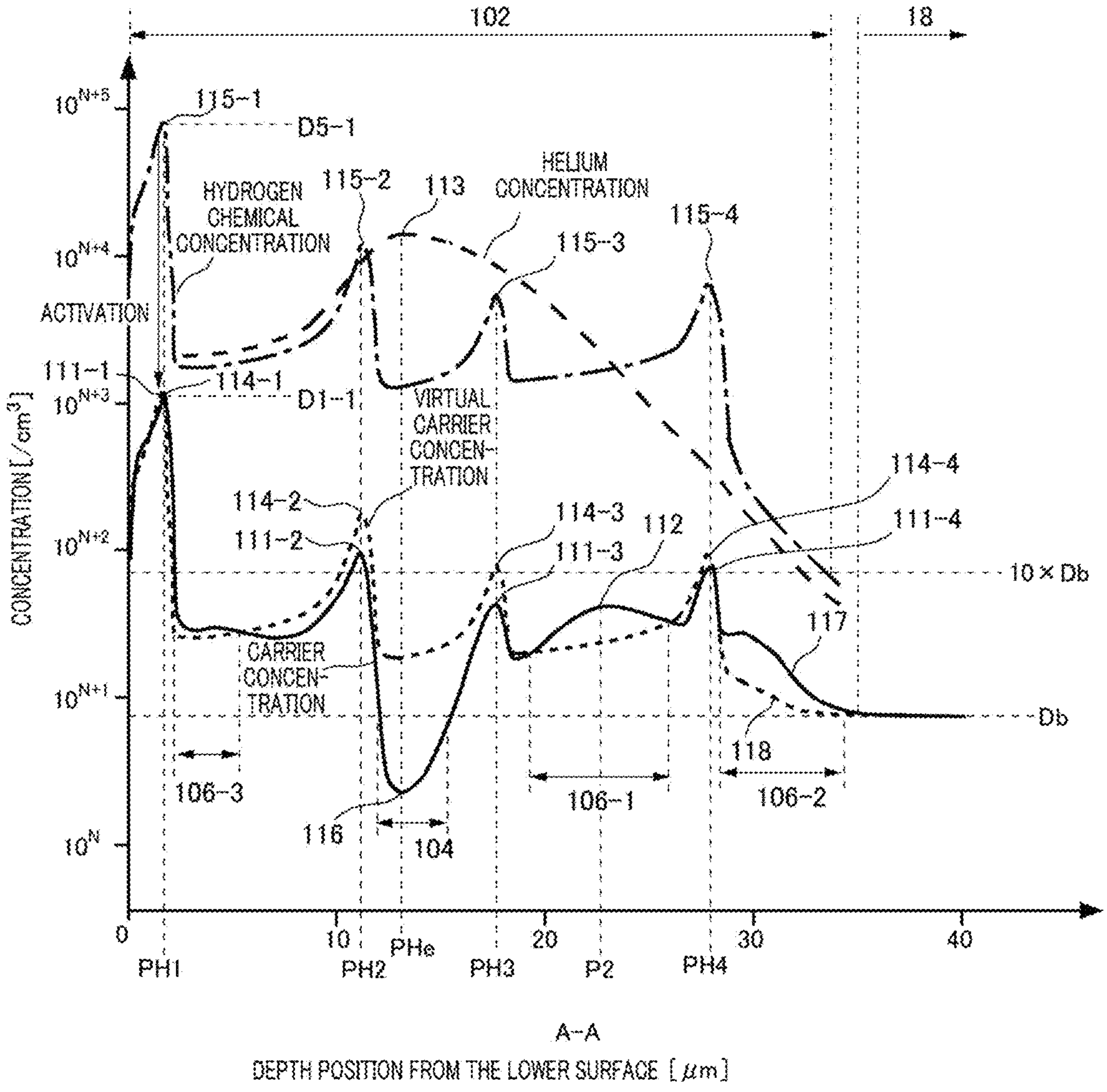
FIG. 2 is a diagram illustrating an example of a distribution of a carrier concentration and a virtual carrier concentration in a section taken along line A-A in FIG. 1.

FIG. 2 is a diagram illustrating an example of a distribution of the carrier concentration and the virtual carrier concentration at a section taken along line A-A in FIG. 1. The section taken along line A-A includes the entirety of the hydrogen containing region 102 and a part of the drift region 18 in the depth direction. FIG. 2 illustrates both the hydrogen chemical concentration distribution and the helium concentration distribution in the section taken along line A-A. Helium is one example of the adjustment impurity for forming the lifetime killer. The vertical axis and the horizontal axis in FIG. 2 are respectively a logarithmic axis indicating the concentrations and a linear axis indicating the depth position from the lower surface 23. Note that the concentration distribution in each figure indicates a distribution in the completed semiconductor device 100 (that is, after the thermal treatment). In addition, the hydrogen chemical concentration and the helium concentration in FIG. 2 are chemical concentrations measured using SIMS method, for example. The carrier concentration in FIG. 2 is measured by SR method, for example.

In this example, the carrier concentration distribution has a first peak 111, the helium concentration distribution has a third peak 113, a virtual carrier concentration distribution has a fourth peak 114, and the hydrogen chemical concentration distribution has a fifth peak 115. Each concentration distribution may have a plurality of the peaks. A plurality of the first peaks 111 include first peaks 111-1, 111-2, 111-3, and 111-4 in this order from the lower surface 23 of the semiconductor substrate 10. A plurality of the third peaks 113 include third peaks 113-1, 113-2, 113-3, and 113-4 in this order from the lower surface 23 of the semiconductor substrate 10. A plurality of the fourth peaks 114 include fourth peaks 114-1, 114-2, 114-3, and 114-4 in this order from the lower surface 23 of the semiconductor substrate 10. A plurality of the fifth peaks 115 include fifth peaks 115-1, 115-2, 115-3, and 115-4 in this order from the lower surface 23 of the semiconductor substrate 10. In addition, depth positions with the fifth peaks 115 in the hydrogen chemical concentration distribution indicating local maximum values are defined as PH1, PH2, PH3, and PH4 in this order from the lower surface 23. In addition, a depth position with the local maximum value of the third peak 113 in the helium concentration distribution is defined as PHe. In addition, a depth position with the local maximum value of the second peak 112 in the carrier concentration distribution in a high concentration region 106-1 is defined as P2.

In the example in FIG. 2, the position with the local maximum value of each first peak 111 in the carrier concentration distribution is the same as the position with the local maximum value of each fifth peak 115 in the hydrogen chemical concentration distribution, but these positions may not exactly match each other. For example, the first peak 111 and the fifth peak 115 may be regarded as being at substantially the same position, as long as the position with the local maximum value of the first peak 111 is included within a range of a full width at half maximum of the fifth peak 115.

The hydrogen containing region 102 includes hydrogen. In this example, the hydrogen containing region 102 includes substantially no N type impurities or P type impurities other than hydrogen. For example, the hydrogen chemical concentration in the hydrogen containing region 102 is no less than 100 times the chemical concentration of the N type impurities and P type impurities. In the example of FIG. 2, a region where the hydrogen chemical concentration is no less than 10 times the base doping concentration Db is the hydrogen containing region 102. The fifth peak 115 in the hydrogen chemical concentration distribution is near the range position at the time of hydrogen ion implantation. When the hydrogen containing region 102 has a plurality of the fifth peaks 115, hydrogen ions may be implanted to the hydrogen containing region 102 multiple times while changing the range. The change in the range may be a change in acceleration energy of hydrogen ions at the time of ion implantation.

The virtual carrier concentration distribution is a distribution as a result of multiplying the hydrogen chemical concentration distribution by an activation ratio lower than 1. That is, the virtual carrier concentration distribution is a distribution with the same shape as the hydrogen chemical concentration distribution but with the concentration value reduced. The activation ratio may be a predetermined value, and may be determined based on the hydrogen chemical concentration distribution and the carrier concentration distribution. For example, the peak value of the fifth peak 115-1 farthest from the third peak 113 in the helium concentration distribution, among the plurality of fifth peaks 115 in the hydrogen chemical concentration distribution, is defined as D 5-1. The peak value of the first peak 111-1 that is at the same depth position as the fifth peak 115-1, among the plurality of first peaks 111 in the carrier concentration distribution, is defined as D 1-1. A ratio (D 1-1/D 5-1) of the peak value D 1-1 of the first peak 111-1 to the peak value D 5-1 of the fifth peak 115-1 may be used as the activation ratio.

The third peak 113 in the helium concentration distribution of this example is arranged between depth positions PH2 and PH3 with the local maximum values of two fifth peaks 115 (the fifth peaks 115-2 and 115-3 in this example) in the hydrogen chemical concentration distribution, in the depth direction. Similarly, the third peak 113 is arranged between two first peaks 111 (the first peaks 111-2 and 111-3 in this example) in the carrier concentration distribution, in the depth direction. For example, the depth position PHe with the local maximum value of the third peak 113 is included in a range of the full width at half maximum (FWHM) of none of the fifth peaks 115. Similarly, the point with the local maximum value of the third peak 113 is included in a range of the full width at half maximum of none of the first peaks 111. With the position of the third peak 113 in the helium concentration distribution being different from the fifth peak 115, the vacancy defects, formed by helium irradiation, can remain without bonding with hydrogen, whereby the carrier lifetime can be reduced. Thus, the formation of the lifetime control region 104 is facilitated. When helium is implanted from the lower surface 23 side, the gradient of the slope that is more on the side of the lower surface 23 than the third peak 113 in the helium concentration distribution is likely to be smaller than the gradient of the slope on the side opposite to the lower surface 23.

The carrier concentration distribution has a higher concentration value in the high concentration region 106 than the virtual carrier concentration distribution. Note that the carrier concentration in the high concentration region 106 is higher than the base doping concentration Db of the semiconductor substrate 10. The high concentration region 106 may be arranged between the first peaks 111 in the carrier concentration distribution. In this example, the high concentration region 106-1 is provided between the deepest first peak 111-4 and the second deepest first peak 111-3 among the first peaks 111 in the carrier concentration distribution.

In this example, the carrier concentration distribution of the high concentration region 106-1 has the second peak 112. The depth position P2 of the second peak 112 in the high concentration region 106-1 is arranged between the depth position PH4 of the first peak 111-4 and the depth position PH3 of the first peak 111-3.

In addition, a high concentration region 106-2 is provided between the first peak 111-4 and the drift region 18. The high concentration region 106-1 and the high concentration region 106-2 may be continuously provided with the first peak 111-4 included. In each high concentration region 106, the maximum value of the carrier concentration may be equal to or greater than 1.1 times, 1.5 times, or twice the virtual carrier concentration at the corresponding depth position.

Each high concentration region 106 may include an adjustment impurity such as helium. The concentration of the adjustment impurity included in the high concentration region 106 may be higher than the base doping concentration Db. The high concentration region 106 may be provided at a position deeper than the third peak 113 in the helium concentration distribution relative to the lower surface 23. In the high concentration region 106, vacancy defects and the like are formed by the helium implantation. The concentration distribution of the vacancy defects will be separately described with reference to FIG. 5. When thermal treatment is performed, the vacancy defects are bonded with hydrogen and oxygen, to be defects including VOH. The defects including VOH function as the donor, whereby the carrier concentration in the high concentration region 106 becomes higher than the virtual carrier concentration. With such a configuration, a carrier concentration distribution different from the virtual carrier concentration distribution can be obtained. On the other hand, in a portion near the third peak 113 in the helium concentration distribution, a large number of vacancy defects are formed. Thus, a rate of remaining vacancy defects is increased and thereby the carrier concentration becomes lower than the virtual carrier concentration. Thus, the lifetime control region 104 can be formed. According to this example, the high concentration region 106 can be formed with the same process as that for the lifetime control region 104.

In addition, a slope 117 of the carrier concentration distribution in the high concentration region 106-2 changes in a more gently sloped manner than a slope 118 of the virtual carrier concentration. That is, the slope 117 of the carrier concentration distribution extends to a deeper position than the slope 118 of the virtual carrier concentration. Thus, for example, with the semiconductor device 100 used as a switching component such as a transistor, switching can be performed with a gently sloped voltage and current waveform. The slope 118 may have the gradient decreasing as the distance from the lower surface 23 increases. That is, the slope 118 may have a downward convex shape. The slope 117 may have the gradient decreasing as the distance from the lower surface 23 increases. That is, the slope 117 may have an upward convex shape.

The carrier concentration in the hydrogen containing region 102 may be higher than the base doping concentration Db of the semiconductor substrate 10. Note that the carrier concentration in the lifetime control region 104 may be smaller than the base doping concentration Db. The carrier concentration distribution may have a valley 116 in the lifetime control region 104. When a region between the fifth peaks 115 in the hydrogen chemical concentration distribution is defined as an inter-peak region, the valley 116 may be arrangement in an inter-peak region that is more on the side of the lower surface 23 than an inter-peak region provided with the high concentration region 106-1. The valley 116 of this example is provided in an inter-peak region adjacent to the inter-peak region provided with the high concentration region 106-1, with the fifth peak 115-3 interposed in between. The valley 116 may be arranged in the inter-peak region that is the same as that including the third peak 113 in the helium concentration distribution.

Figure 3:
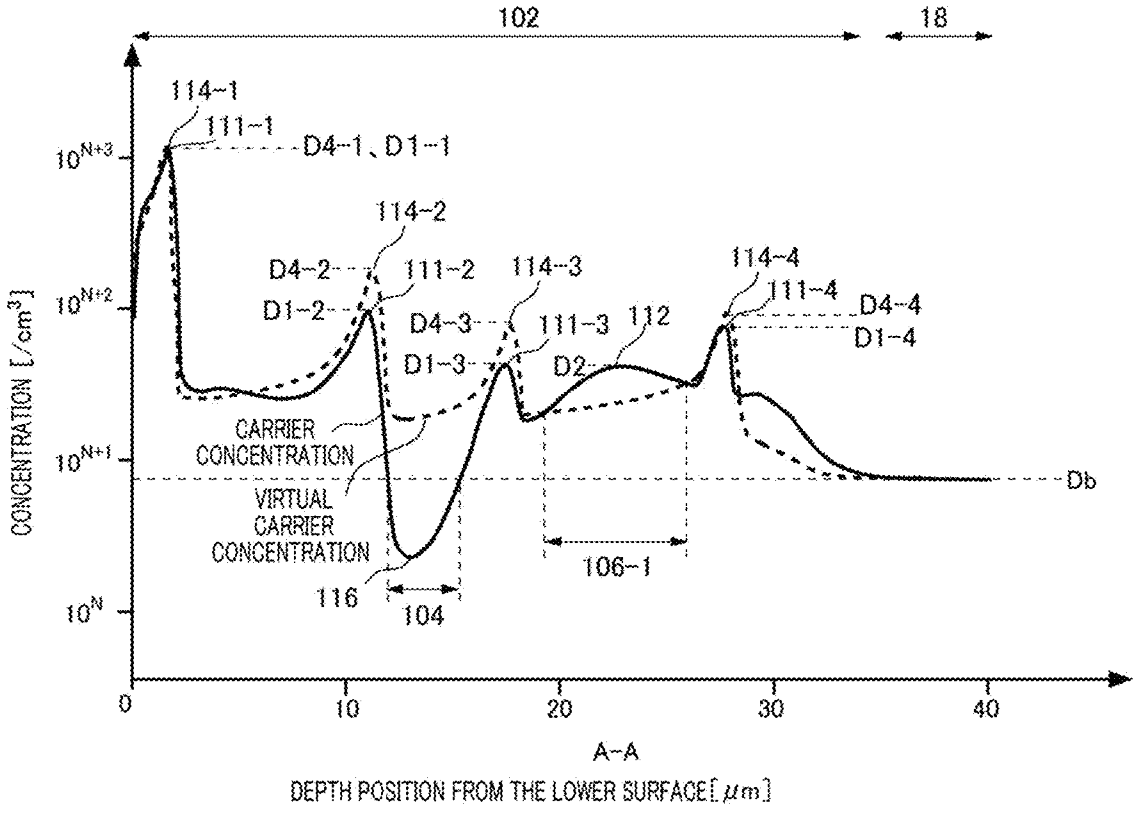
FIG. 3 is a diagram illustrating a carrier concentration distribution and a virtual carrier concentration distribution.

FIG. 3 is a diagram illustrating a carrier concentration distribution and a virtual carrier concentration distribution. The carrier concentration distribution and the virtual carrier concentration distribution in FIG. 3 are the same as those in the example illustrated in FIG. 2. In this example, the local maximum value of each first peak 111 in the carrier concentration distribution is defined as D1, and the local maximum value of the fourth peak 114 in the virtual carrier concentration distribution is defined as D4. In addition, the local maximum value of the carrier concentration distribution of the high concentration region 106-1 is defined as D2.

The local maximum value D1 of any of the first peaks 111 in the carrier concentration distribution may not exceed the virtual carrier concentration at the corresponding depth position. For example, the local maximum value D1 of at least one of the two first peaks 111-2 and 111-3 arranged on both sides of the lifetime control region 104 or the valley 116 is smaller than the local maximum value D4 of the corresponding fourth peak(s) 114-2, 114-3. In a portion near the lifetime control region 104, a large number of vacancy defects remains without being VOH defects, and thus the carrier concentration is likely to be low.

Figure 4:
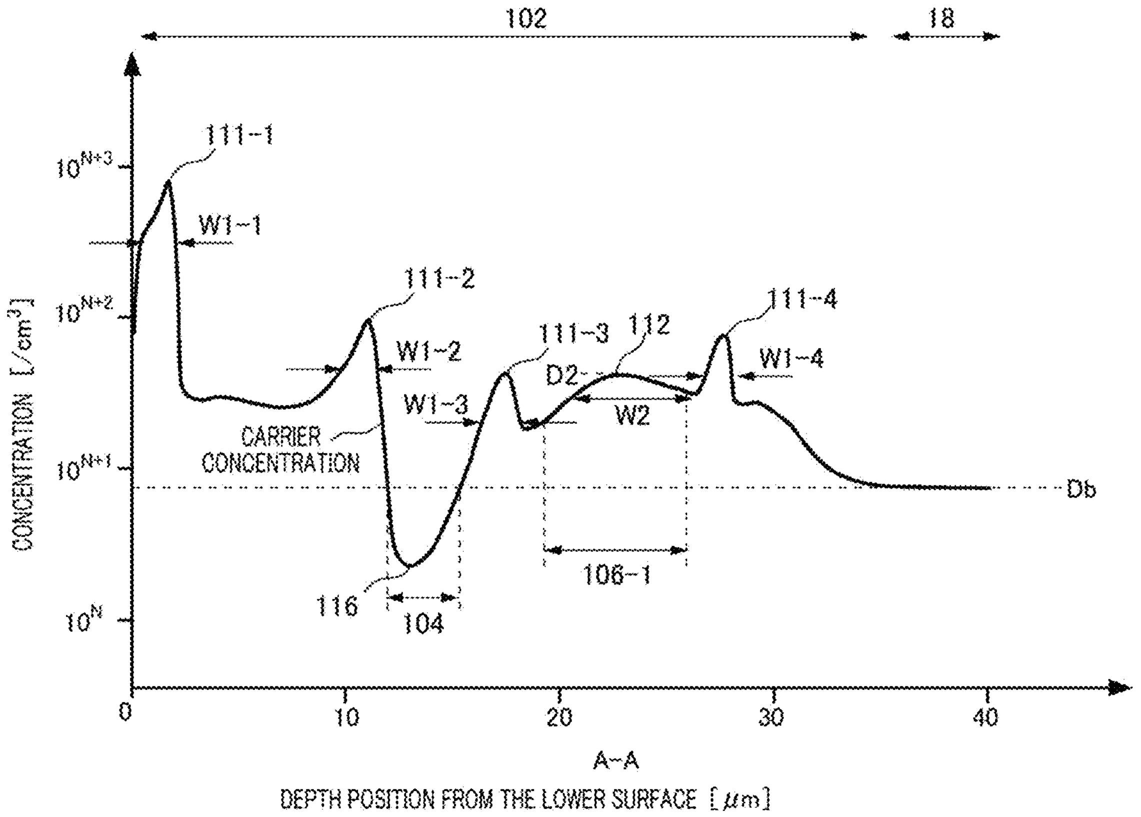
FIG. 4 is a diagram illustrating a second peak 112 in a high concentration region 106-1.

FIG. 4 is a diagram illustrating the second peak 112 in the high concentration region 106-1. The carrier concentration distribution in FIG. 4 is the same as that in the example illustrated in FIG. 2. The second peak 112 is a peak more gently sloped than any of the two first peaks 111-3 and 111-4 on both sides of the second peak 112 in the depth direction. A width W2 of the second peak 112 in the depth direction is greater than any of widths W1-3 and W1-4 of the first peaks 111-3 and 111-4 in the depth direction. The full width at half maximum may be used as the width of each peak. When the full width at half maximum cannot be measured at each peak, the width of each peak may be defined using a reference other than the full width at half maximum. For example, the width of each peak may be a width of a region with the concentration being 80% (0.8×D) or more of the local maximum value D of the peak.

The width W2 of the second peak 112 may be greater than the width W1 of any of the first peaks 111 in the hydrogen containing region 102. With this example, a uniform carrier concentration distribution can be obtained in a region, in the hydrogen containing region 102, close to the drift region 18.

Figure 5:
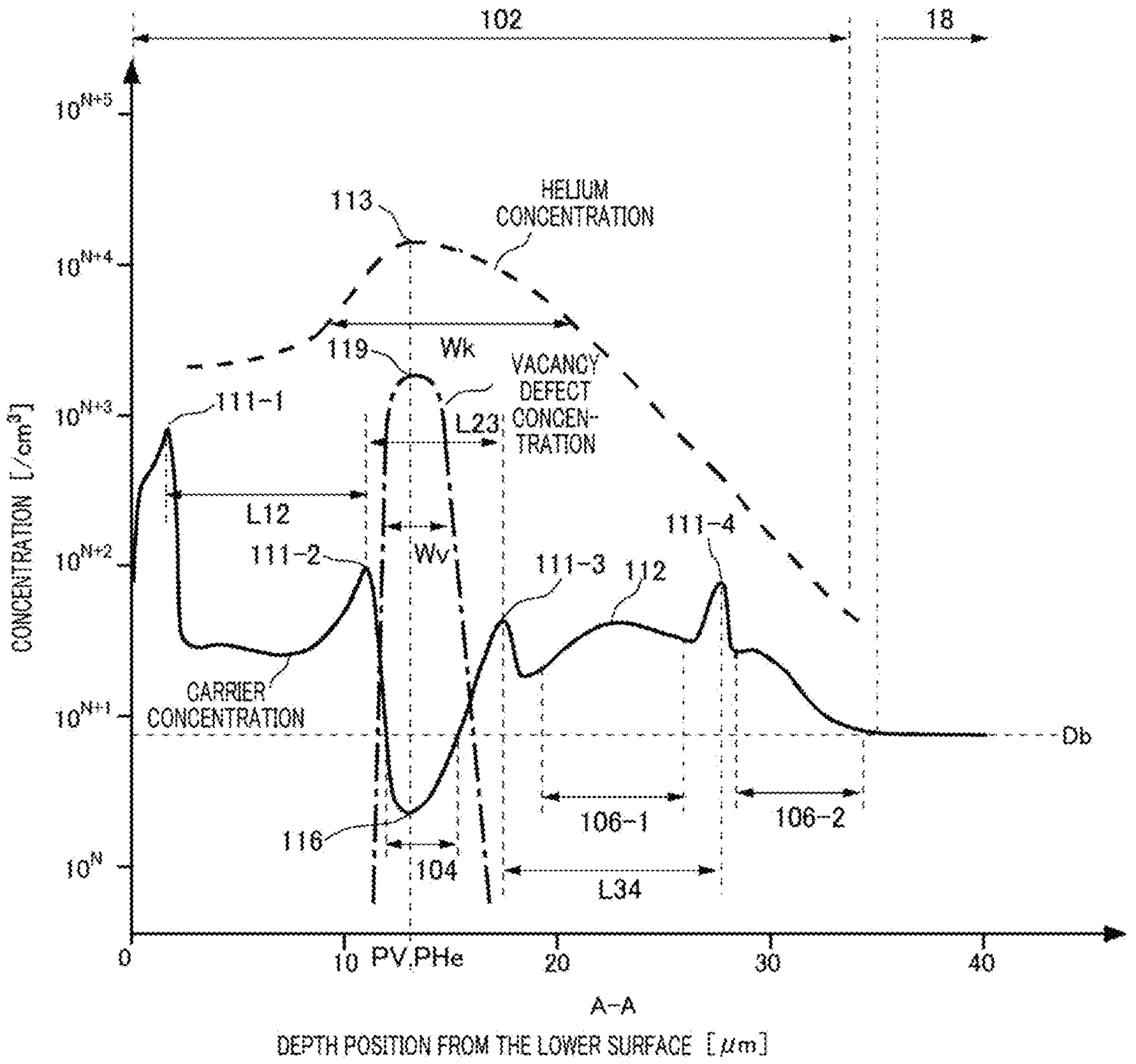
FIG. 5 is a diagram illustrating a third peak 113 in a helium concentration distribution.

FIG. 5 is a diagram illustrating the third peak 113 in the helium concentration distribution. FIG. 5 also illustrates a vacancy defect concentration distribution. The vacancy defect concentration distribution is a distribution of the concentration of vacancy defects formed by the ion implantation with the adjustment impurity such as helium ions. The vacancy defect concentration distribution has a peak 119. The carrier concentration distribution and the helium concentration distribution in FIG. 5 are the same as those in the example illustrated in FIG. 2. In this example, the width of the third peak 113 in the depth direction is defined as Wk. The full width at half maximum of the third peak 113 may be used as the width Wk. In addition, a width of an inter-peak region between the first peaks 111 in the carrier concentration distribution is defined as L. In the example of FIG. 5, the width of an inter-peak region between the first peaks 111-1 and 111-2 is defined as L12, the width of an inter-peak region between the first peaks 111-2 and 111-3 is defined as L23, and the width of an inter-peak region between the first peaks 111-3 and 111-4 is defined as L34.

The width Wk of the third peak 113 of this example is greater than the width L of any of the inter-peak regions. A range of the width Wk of the third peak 113 may include a plurality of first peaks 111. In the example of in FIG. 5, the first peaks 111-2 and 111-3 are included in the range of the width Wk. The width Wk may be 5 μm or more and may be 10 μm or more. The width Wk may be smaller than the width of the hydrogen containing region 102 in the depth direction. By setting the width Wk of the third peak 113 to be large, helium can also be distributed at positions apart from the peak position PHe of the third peak 113. Thus, the high concentration region 106 can be formed with VOH defects formed at positions apart from the peak position PHe. In addition, the high concentration region 106 can be easily formed near the drift region 18, whereby the carrier concentration distribution near the drift region 18 can be gradually changed.

The peak 119 in the vacancy defect concentration distribution may be positioned near the third peak 113 in the helium concentration distribution. In this example, the peak position PV of the peak 119 matches the peak position PHe of the third peak 113. The peak position PV of the peak 119 may not match the peak position PHe of the third peak 113. The vacancy defect concentration distribution may include the position PHe of the third peak 113 in the helium concentration distribution. The distribution of the peak 119 in the vacancy defect concentration distribution is narrower than the distribution width of the third peak 113 in the helium concentration distribution. The position PV of the peak 119 may be positioned between the peak positions of the two hydrogen concentrations adjacent to each other in the depth direction with the position PHe interposed in between. The peak 119 in the vacancy defect concentration distribution of this example is distributed between the first peaks 111-2 and 111-3 of the carrier concentration. A width Wv between the two positions with the concentration being 10% of the peak concentration of the vacancy defect concentration distribution may be shorter than a width L23. The vacancy defects are formed inside the semiconductor substrate 10 by the ion implantation with the adjustment impurity. Hydrogen existing around the vacancy defects terminates the dangling bonds of the vacancy defects. Thus, the concentration of the vacancy defects formed decreases. The vacancy defect concentration particularly decreases at the first peaks 111-2 and 111-3 due to the high hydrogen chemical concentration thereat. Thus, the distribution of the vacancy defect concentration is limited between the first peaks 111-2 and 111-3. That is, the depth and the width of the recombination center can be accurately controlled, with the recombination center due to the vacancy defects locally distributed between two carrier concentration peaks. The gradient of the concentration slopes on both sides of the peak position PV in the vacancy defect concentration distribution may be greater than the gradient of the concentration slope on both sides of the peak position PHe in the helium concentration distribution.

Figure 6:
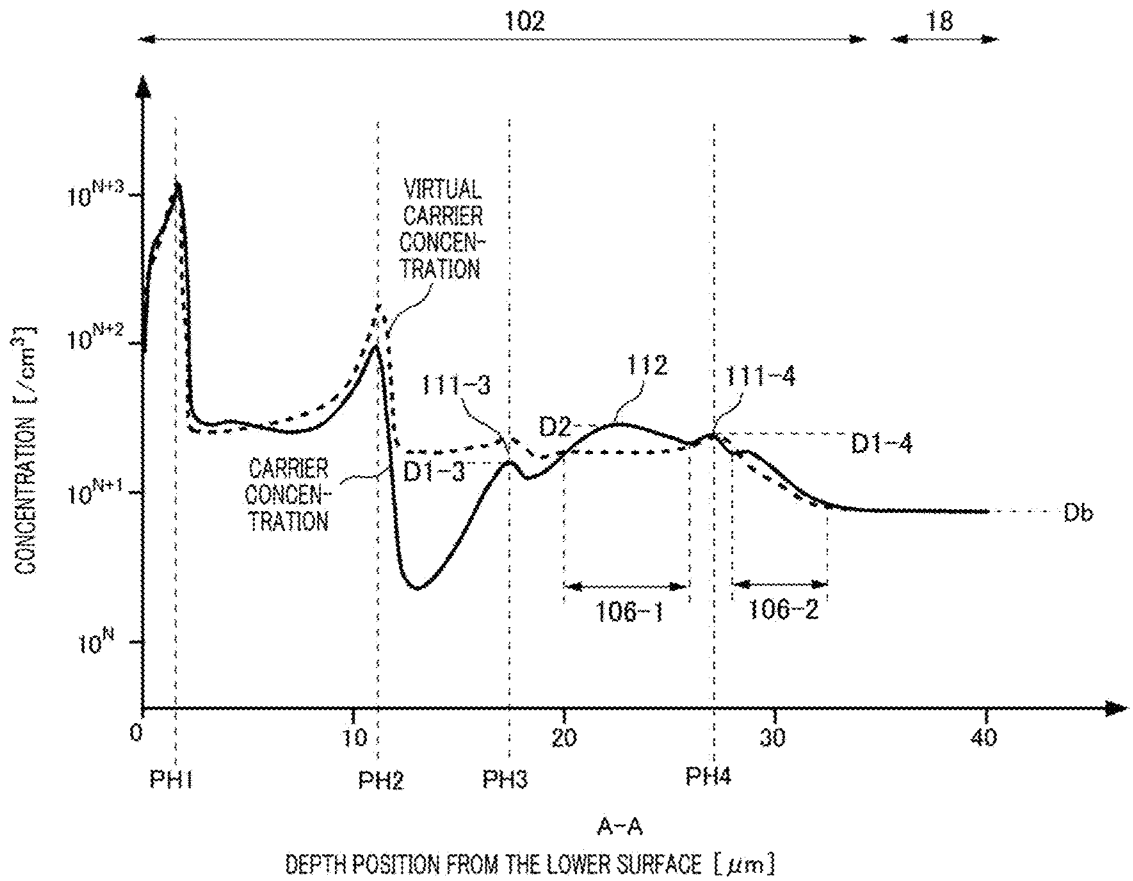
FIG. 6 is a diagram illustrating another example of the carrier concentration distribution and the virtual carrier concentration distribution.

FIG. 6 is a diagram illustrating another example of the carrier concentration distribution and the virtual carrier concentration distribution. In the carrier concentration distribution described with reference to FIG. 2 to FIG. 5, the local maximum value D2 of the second peak 112 is smaller than any of the local maximum values D1-3 and D1-4 of the two first peaks 111-3 and 111-4 on both sides of the second peak 112. Alternatively, the local maximum value D2 of the second peak 112 may be larger than at least one of the local maximum values D1-3 and D1-4. In this example, the local maximum value D2 of the second peak 112 is larger than any of the local maximum values D1-3 and D1-4. With such a configuration, the carrier concentration distribution can be even more gradually changed near the drift region 18.

The carrier concentration distribution illustrated in FIG. 6 has a local minimum value (valley) between the first peak 111-3 and the second peak 112 and between the second peak 112 and the first peak 111-4. In an alternative example, the carrier concentration distribution may not have a local minimum value (valley) at least either of between the first peak 111-3 and the second peak 112 and between the second peak 112 and the first peak 111-4. The carrier concentration distribution may include a single peak formed between the depth positions PH3 and PH4. That is, the carrier concentration distribution between the depth positions PH3 and PH4 may not have a local minimum value (valley).

Figure 7:
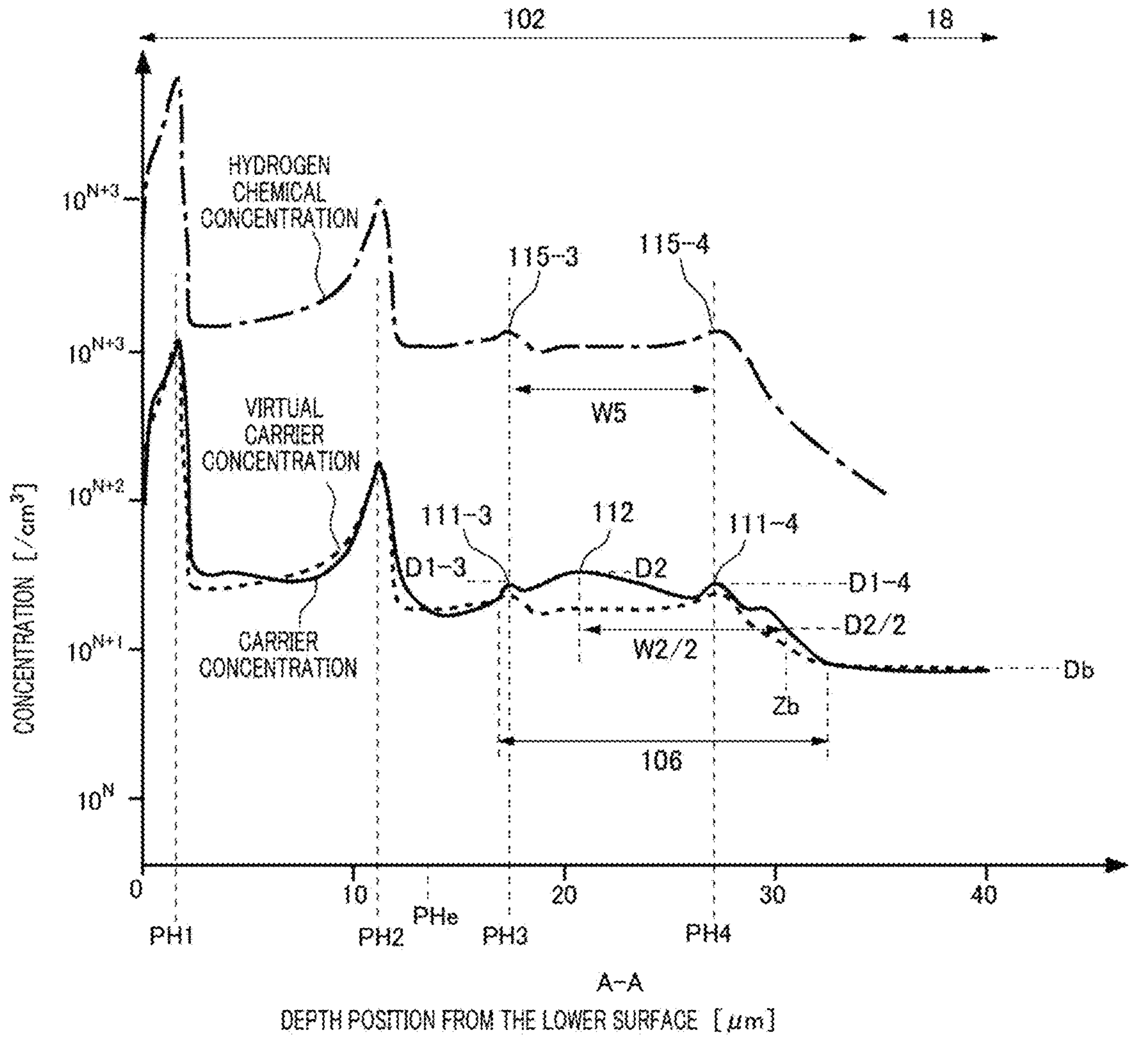
FIG. 7 is a diagram illustrating another example of the carrier concentration distribution and the virtual carrier concentration distribution.

FIG. 7 is a diagram illustrating another example of the carrier concentration distribution and the virtual carrier concentration distribution. This example features the width W2 of the second peak 112 that is greater than that in the examples illustrated in FIG. 1 to FIG. 6. For example, by adjusting the oxygen concentration in the semiconductor substrate 10, the second peak 112 with the greater width W2 can be formed. The oxygen concentration in the semiconductor substrate 10 in this example may be $1\times10^{17}/cm^3$ or more, $5\times10^{17}/cm^3$ or more, and may be $1\times10^{18}/cm^3$ or more. Alternatively, the oxygen concentration may be $1\times10^{18}/cm^3$ or less. The other configurations may be the same as those in the examples illustrated in FIG. 1 to FIG. 6. The semiconductor substrate 10 may be a substrate manufactured by the MCZ method.

Also in this example, helium is implanted at the depth position PHe. Thus, the high concentration region 106 can be formed. The dose of helium may be $5\times10^{10}/cm^2$ or more, $1\times10^{11}/cm^2$ or more, and may be $1\times10^{12}/cm^2$ or more. In addition, helium may be implanted at a plurality of depth positions by changing the range, to achieve an even distribution of helium over a wide range. In this case, the total dose of helium may be $5\times10^{10}/cm^2$ or more, $1\times10^{11}/cm^2$ or more, and may be $1\times10^{12}/cm^2$ or more. Alternatively, the full width at half maximum of helium ions may be increased by increasing the acceleration energy of the helium ions.

The full width at half maximum W2 of the second peak 112 of this example may be greater than a half of a fifth peak interval W5 between the deepest fifth peak 115-4 and the second deepest fifth peak 115-3 of the fifth peaks 115 in the hydrogen chemical concentration distribution. In this example, the dose for the fifth peak 115-4, which is at the deepest position, may be $1\times10^{12}/cm^2$ or more, $7\times10^{12}/cm^2$ or more, and may be $1\times10^{13}/cm^2$ or more. With a large dose for the fifth peak 115-4, the amount of hydrogen for terminating vacancy defects can be ensured. This facilitates the formation of the second peak 112 with a large width W2.

Note that a depth position where the carrier concentration, monitored from the vertex of the second peak 112 toward the drift region 18, first reaches the half of the vertex concentration D2 (D2/2) is defined as Zb. The distance from the vertex of the second peak 112 to the depth position Zb in the depth direction may be the half of the full width at half maximum W2. That is, the full width at half maximum W2 may be a double of this distance. In this case, the full width at half maximum W2 can be defined, even when the carrier concentration does not drop to or below D2/2 more on the side of the lower surface 23 than the vertex of the second peak 112.

With the large width W2, the carrier concentration distribution in the hydrogen containing region 102 can be flattened while having high concentration. For example, when the hydrogen containing region 102 is used as a buffer region described later, the voltage waveform during reverse recovery of the semiconductor device 100 can be gently sloped, whereby soft recovery can be achieved. In addition, the field intensity on the lower surface 23 side is relaxed, whereby an avalanche withstand capability on the lower surface 23 side can be improved. The full width at half maximum W2 of the second peak 112 may be equal to or larger than the fifth peak interval W5.

The vertex of each of the fifth peak 115-4 and the fifth peak 115-3 may be arranged within a depth range of the full width at half maximum W2 of the second peak 112. Thus, the second peak 112 can be more gently sloped. In this case, the carrier concentration distribution may have the fourth peak 114 or a kink at each of the depth positions PH3 and PH4. The kink is a point where the gradient of the distribution waveform (that is, derivative) discontinuously changes. In addition, the full width at half maximum W2 of the second peak 112 may be 5 μm or more, 10 μm or more, or 15 μm or more.

Figure 8:
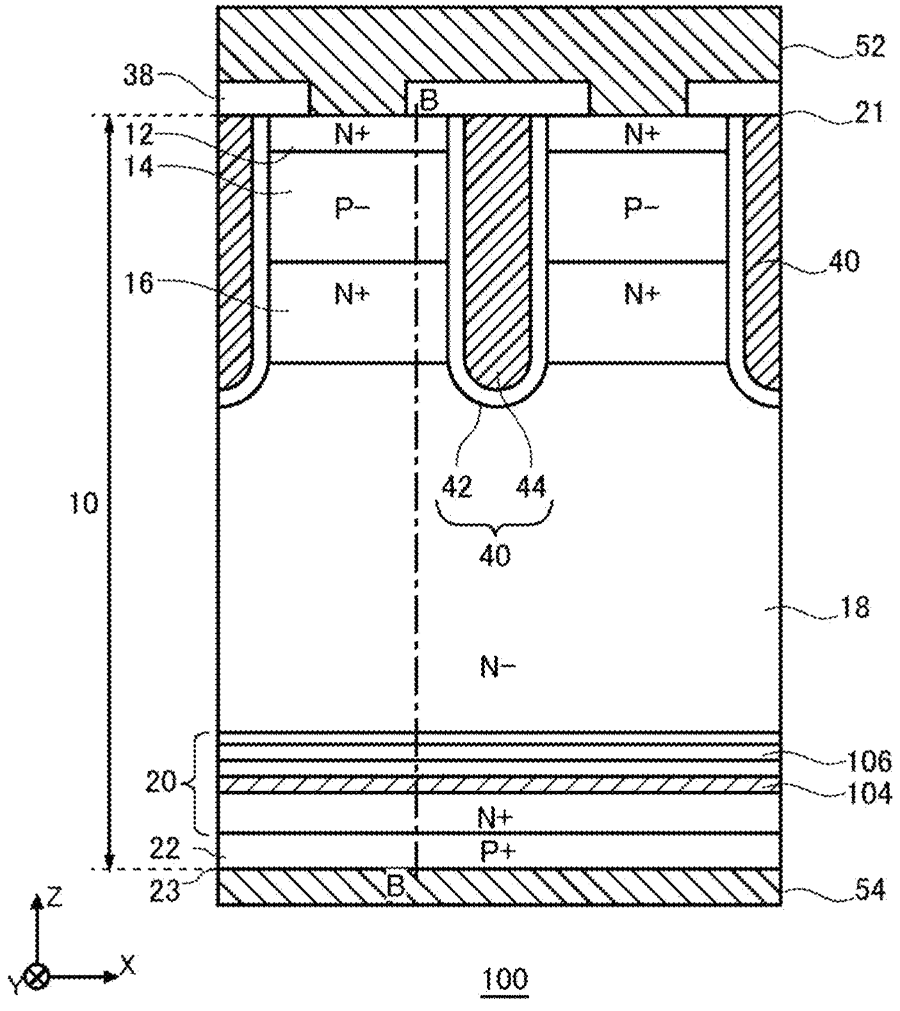
FIG. 8 is a diagram illustrating an exemplary structure of the semiconductor device 100.

FIG. 8 is a diagram illustrating an exemplary structure of the semiconductor device 100. The semiconductor device 100 of this example functions as an insulated gate bipolar transistor (IGBT). The semiconductor device 100 of this example comprises a semiconductor substrate 10, an interlayer dielectric film 38, an emitter electrode 52, and a collector electrode 54. The interlayer dielectric film 38 is formed such that it covers at least a portion of the upper surface 21 of the semiconductor substrate 10. Through-holes such as a contact hole are formed on the interlayer dielectric film 38. The contact hole exposes the upper surface 21 of the semiconductor substrate 10. The interlayer dielectric film 38 may be silicate glass such as PSG, BPSG, and the like and may be an oxide film, nitride film, or the like.

The emitter electrode 52 is formed on the upper surface of the semiconductor substrate 10 and an upper surface of the interlayer dielectric film 38. The emitter electrode 52 is also formed inside of the contact hole and in contact with the upper surface 21 of the semiconductor substrate 10 exposed by the contact hole.

The collector electrode 54 is formed on the lower surface 23 of the semiconductor substrate 10. The collector electrode 54 may be in contact with the entire lower surface 23 of the semiconductor substrate 10. The emitter electrode 52 and the collector electrode 54 are formed of a metal material such as aluminum.

In the semiconductor substrate 10 of this example, an N− type drift region 18, an N+ type emitter region 12, a P− type base region 14, an N+ type accumulation region 16, an N+ type buffer region 20, and a P+ type collector region 22 are provided.

The emitter region 12 is provided in contact with the upper surface 21 of the semiconductor substrate 10 and has a donor concentration higher than that in the drift region 18. The emitter region 12 includes an N type impurity such as phosphorous, for example.

The base region 14 is provided between the emitter region 12 and the drift region 18. The base region 14 includes a P type impurity such as boron, for example.

The accumulation region 16 is provided between the base region 14 and the drift region 18 and has one or more donor concentration peaks whose donor concentration is higher than that in the drift region 18. The accumulation region 16 may include an N type impurity such as phosphorous, or may include hydrogen.

The collector region 22 is provided in contact with the lower surface 23 of the semiconductor substrate 10. An acceptor concentration in the collector region 22 may be higher than an acceptor concentration in the base region 14. The collector region 22 may include the same P type impurity as the one in the base region 14 and may include a different P type impurity.

The buffer region 20 is provided between the collector region 22 and the drift region 18 and has one or more donor concentration peaks whose donor concentration is higher than that in the drift region 18. The buffer region 20 includes an N type impurity such as hydrogen. The buffer region 20 may function as a field stop layer to prevent a depletion layer spread from a side of a lower surface of the base region 14 from reaching the collector region 22.

The hydrogen containing region 102 described with reference to FIG. 1 from FIG. 7 is included in the buffer region 20. In this example, the hydrogen containing region 102 functions as the entirety of the buffer region 20. The buffer region 20 of this example includes the high concentration region 106 described with reference to FIG. 1 to FIG. 7. The buffer region 20 may further include the lifetime control region 104 described with reference to FIG. 1 to FIG. 7.

With the buffer region 20 provided with the high concentration region 106, the carrier concentration distribution of the buffer region 20 can be moderately changed near the drift region 18. Thus, the waveform of the voltage and current can be changed gradually at the time of switching of the semiconductor device 100. In addition, a high donor concentration can be achieved near the drift region 18, so that the expansion of the depletion layer from the lower surface side of the base region 14 can be more effectively suppressed.

A gate trench section 40 passes through the upper surface 21 of the semiconductor substrate 10, the emitter region 12, the base region 14, and the accumulation region 16 to the drift region 18. The accumulation region 16 of this example is placed above a lower end of the gate trench section 40. The accumulation region 16 may be provided such that it covers the entire lower surface of the base region 14. Providing the accumulation region 16 having a higher concentration than that in the drift region 18 between the drift region 18 and the base region 14 enhances carrier injection enhancement effect (Injection-Enhancement effect, IE effect), thus reducing ON voltage at the IGBT.

The gate trench section 40 comprises a gate trench, a gate dielectric film 42, and a gate conductive section 44 formed closer to the upper surface of the semiconductor substrate 10. The gate dielectric film 42 is formed such that it covers the inner wall of the gate trench. The gate dielectric film 42 may be formed by oxidizing or nitriding the semiconductor of the inner wall of the gate trench. The gate conductive section 44 is formed deeper inside the gate trench than the gate dielectric film 42. That is, the gate dielectric film 42 insulates the gate conductive section 44 and the semiconductor substrate 10. The gate conductive section 44 is formed of a conductive material such as polysilicon.

The gate conductive section 44 includes a region opposite to the base region 14 intervening the gate dielectric film 42. Although the gate trench section 40 of this cross section is covered with the interlayer dielectric film 38 in the upper surface of the semiconductor substrate 10, the gate conductive section 44 is connected with a gate electrode in other cross sections. When a predetermined gate voltage is applied to the gate conductive section 44, a channel of electron inversion layer is formed on an outer layer of the base region 14 interfacing the gate trench section 40.

Figure 9:
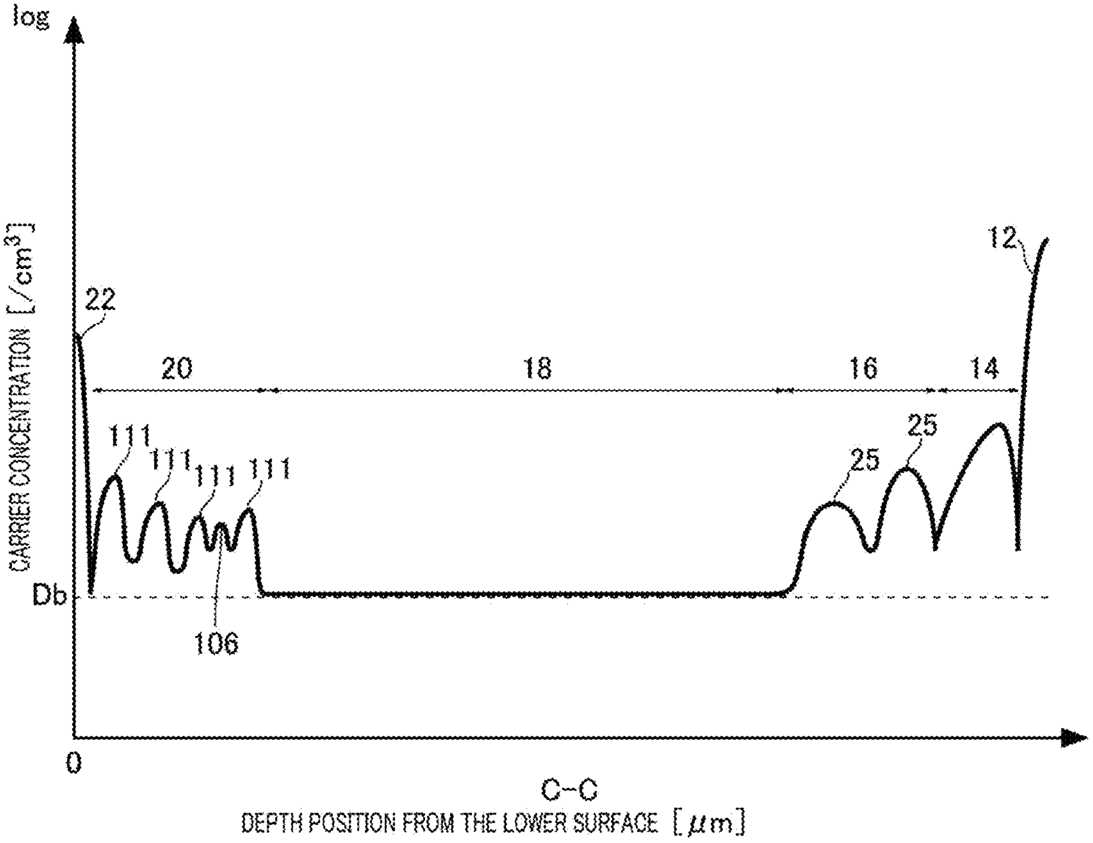
FIG. 9 is a diagram illustrating an example of a carrier concentration distribution in the depth direction at a position taken along B-B line in FIG. 8.

FIG. 9 is a diagram illustrating an example of a carrier concentration distribution in the depth direction at a position taken along B-B line in FIG. 8. The vertical axis and the horizontal axis in FIG. 9 are respectively a logarithmic axis indicating the carrier concentration and a linear axis indicating the distance from the lower surface 23.

A carrier concentration distribution in the buffer region 20 of this example has multiple first peaks 111 provided at different positions in the depth direction. The buffer region 20 includes the high concentration region 106 between the first peaks 111. The buffer region 20 may include the high concentration region 106 between the drift region 18 and one of a plurality of first peaks 111 closest to the drift region 18. With the high concentration region 106 provided, prevention of expansion of the depletion layer from the upper surface 21 side is facilitated.

The accumulation region 16 of this example includes multiple peaks 25, but the accumulation region 16 may have a single peak 25. The peaks 25 are donor concentration peaks. The peaks 25 may be formed by implanting hydrogen. In this case, the high concentration region 106 can be provided in the accumulation region 16. The lifetime control region 104 may be provided below the accumulation region 16, and the high concentration region 106 may be provided inside the accumulation region 16. The high concentration region 106 may function as the peak 25 in the accumulation region 16. The high concentration region 106 may be formed over the entirety of the accumulation region 16 in the depth direction.

Figure 10:
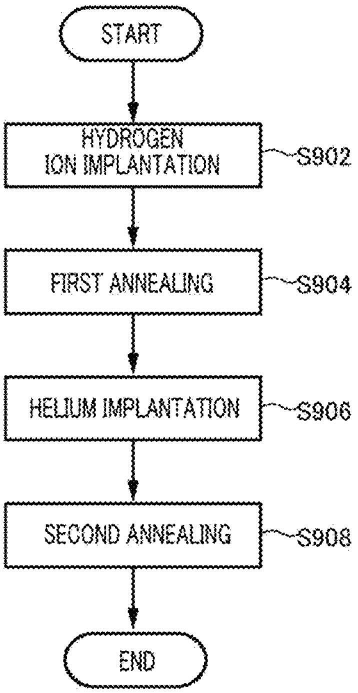
FIG. 10 is a flow diagram illustrating part of a method of manufacturing the semiconductor device 100.

FIG. 10 is a flow diagram illustrating part of a method of manufacturing the semiconductor device 100. FIG. 10 illustrates a step of forming the high concentration region 106. The structures illustrated in FIG. 8 are formed before and after the step illustrated in FIG. 10.

At S902, hydrogen ions are implanted from the lower surface 23 side of the semiconductor substrate 10. At S902, hydrogen ions may be implanted a plurality of times while changing the range. Next, at S904, the semiconductor substrate 10 is annealed. This results in formation of hydrogen donors and VOH defects, and thus the hydrogen containing region 102 is formed.

Next, at S906, an adjustment impurity such as helium is implanted into the hydrogen containing region 102. At S906, as described above with reference to FIG. 5 and the like, helium is preferably implanted to make the width Wk of the third peak 113 in the helium concentration distribution larger than the interval of the fifth peaks 115 in the hydrogen chemical concentration distribution. At S906, helium may be implanted for a plurality of times while changing the range, to form a third peak 113 with a larger width Wk. The helium concentration distribution may have a plurality of third peaks 113. The range of helium ions in the silicon substrate is about 10 μm when acceleration energy is 2.5 MeV.

Note that in the embodiment illustrated in FIG. 7, to increase the width W2 of the second peak 112 by a single implantation of helium ions, the acceleration energy may be set to be even higher. In this case, the range of helium ions is deeper than a predetermined position. Thus, an absorber such as aluminum with a predetermined thickness is inserted between the helium ion accelerator and the semiconductor substrate. The second peak 112 of the helium ions may be adjusted to be at a predetermined depth from the implantation surface of the semiconductor substrate with the absorber absorbing the energy of the helium ions. As one example, the full width at half maximum of about 12 μm is obtained with the acceleration energy of helium ions set to be 24 MeV.

Next, at S908, the semiconductor substrate 10 is annealed. The annealing condition at S908 may be the same as or different from that at S904. The thermal treatment performed on the semiconductor substrate 10 at S908 results in formation of the high concentration region 106 in the hydrogen containing region 102.

At S902 and S906, the concentration of hydrogen or helium implanted may be adjusted based on the concentration of carbon included in the semiconductor substrate 10. For example, the concentration of hydrogen or helium implanted may be lowered for a higher concentration of carbon included in the semiconductor substrate 10. Thus, the high concentration region 106 with a constant concentration can be formed regardless of the concentration of carbon included in the semiconductor substrate 10.

Figure 11:
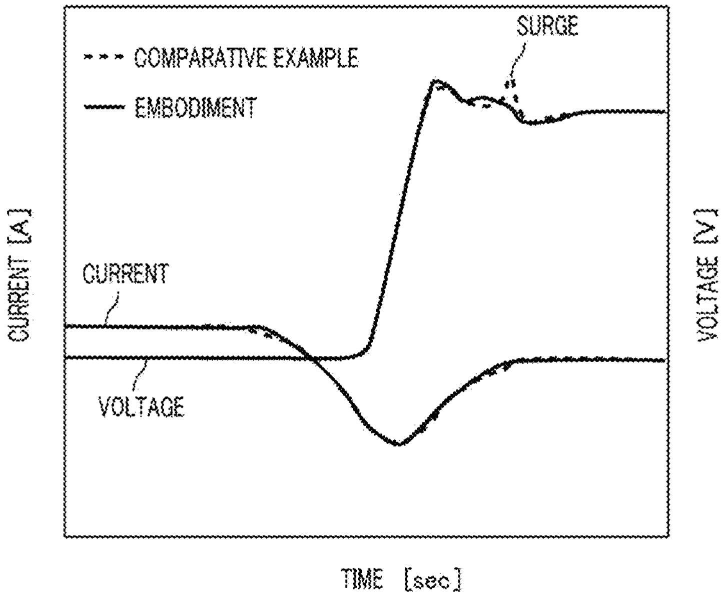
FIG. 11 is a diagram illustrating one example of voltage and current waveform during reverse recovery of the semiconductor device 100.

FIG. 11 is a diagram illustrating one example of voltage and current waveform during reverse recovery of the semiconductor device 100. FIG. 11 illustrates a waveform of the semiconductor device 100 according to the embodiment illustrated in FIG. 8 and a waveform of a semiconductor device according to a comparative example. The semiconductor device according to the comparative example is different from the semiconductor device 100 in that the high concentration region 106 is not provided. The other structures are the same as those in the semiconductor device 100.

As illustrated in FIG. 11, in the comparative example, di/dt of the current waveform becomes large immediately before the reverse recovery current disappears. Thus, the voltage waveform has a relatively large surge. On the other hand, the buffer region 20 according to the embodiment has a gently sloped carrier concentration distribution, so that the current waveform can be gently sloped until the end of the reverse recovery operation. Thus, the surge in the voltage waveform can be suppressed.

While the present invention has been described through the embodiments, the technical scope of the invention is not limited to the scope of the above-described embodiments. It is apparent to those skilled in the art that various alterations or improvements can be added to the above-described embodiments. It is also apparent from the claims that the embodiments provided with such alterations or improvements shall fall in the technical scope of the invention.

It should be noted that the operations, procedures, steps, stages, and the like of each process performed by an apparatus, system, program, and method shown in the claims, embodiments, or drawings can be performed in any order as long as the order is not indicated by "prior to," "before," or the like and as long as the output from a previous process is not used in a later process. Even if process flows are described using phrases such as "first" or "next" in the claims, embodiments, or drawings for convenience, it does not necessarily mean that they must be performed in this order.

EXPLANATION OF REFERENCES

10: Semiconductor Substrate, 12: Emitter Region, 14: Base Region, 16: Accumulation Region, 18: Drift Region, 20: Buffer Region, 21: Upper Surface, 22: Collector Region, 23: Lower Surface, 25: Peak, 38: Interlayer Dielectric Film, 40: Gate Trench Section, 42: Gate Dielectric Film, 44: Gate Conductive Section, 52: Emitter Electrode, 54: Collector Electrode, 100: Semiconductor Device, 102: Hydrogen Containing Region, 104: Lifetime Control Region, 106: High Concentration Region, 111: First Peak, 112: Second Peak, 113: Third Peak, 114: Fourth Peak, 115: Fifth Peak, 116: Valley, 117: Slope, 118: Slope, 119: Peak

What is claimed is:

1. A semiconductor device comprising a semiconductor substrate including an upper surface and a lower surface, wherein the semiconductor substrate includes an n-type semiconductor region having a hydrogen containing region, and a carrier concentration distribution representing a carrier concentration by a semi-logarithmic graph in the depth direction of the n-type semiconductor region includes:

a flat portion bridging the hydrogen containing region and a drift region, which is a substantially flat region and contains a first flat part in the drift region and a separate second flat part in the hydrogen containing region located closer to the lower surface of the semiconductor substrate than the first plat part; and a slope including a gently sloped peak located between the first flat part and the second flat part.

2. The semiconductor device of claim 1, wherein the n-type semiconductor region includes a drift region, a carrier concentration of which is lower than that of the hydrogen containing region.

3. The semiconductor device of claim 1, wherein a change of the carrier concentration in the flat portion is within a range of values of +20%.

4. The semiconductor device of claim 3, wherein a carrier concentration of the first flat part is 80% or more and 120% or less of that of the semiconductor substrate; and a length of the first flat part is within 70% of a thickness of the semiconductor substrate.

5. The semiconductor device of claim 3, wherein the carrier concentration distribution of the hydrogen containing region includes the slope.

6. The semiconductor device of claim 5, wherein the slope includes an upward convex shape.

7. The semiconductor device of claim 3, wherein the carrier concentration distribution includes at least one peak that is closer to the lower surface than the slope.

8. The semiconductor device of claim 7, wherein the second flat part is located between the slope and the at least one peak.

9. The semiconductor device of claim 8, wherein a carrier concentration of the second flat part is lower than a carrier concentration of a half-value of the at least one peak of the carrier concentration distribution.

10. The semiconductor device of claim 9, wherein a length between the at least one peak and an end point located closest to the lower surface among points at which the carrier concentration is constant in the depth direction of the second flat part is smaller than a length of the flat portion.

11. The semiconductor device of claim 10, wherein a gradient at the end point is substantially zero.

12. The semiconductor device of claim 10, wherein the end point is an end point of a high concentration region in which a carrier concentration is higher than a virtual carrier concentration.

13. The semiconductor device of claim 8, wherein the at least one peak of the carrier concentration distribution is located closest to the drift region in the hydrogen containing region.

14. The semiconductor device of claim 7, wherein the second flat part includes the at least one peak that is flattened, and a full width at half maximum of the flattened peak is 5 μm or more.

15. The semiconductor device of claim 7, wherein the second flat part includes the at least one peak that is flattened, and a full width at half maximum of the flattened peak is 10 μm or more.

16. The semiconductor device of claim 7, wherein the second flat part includes the at least one peak that is flattened, and a full width at half maximum of the flattened peak is 15 μm or more.

17. The semiconductor device of claim 14, wherein the second flat part further includes one or more other peaks.

18. The semiconductor device of claim 14, wherein the second flat part includes a local maximum value corresponding to the at least one peak and a local minimum value which corresponds to a valley in a range of values of +20% within which a change of the carrier concentration in the flat portion is.

19. A semiconductor device comprising a semiconductor substrate including an upper surface and a lower surface, wherein the semiconductor substrate includes an n-type semiconductor region having a hydrogen containing region, and a carrier concentration distribution representing a carrier concentration by a semi-logarithmic graph in the depth direction of the n-type semiconductor region includes:

a flat portion bridging the hydrogen containing region and a drift region, which is a substantially flat region and contains a first flat part in the drift region and a separate second flat part in the hydrogen containing region located closer to the lower surface of the semiconductor substrate than the first plat part; and a slope is located between the first flat part and the second flat part, wherein the first flat part, the slope and the second flat part are arranged directly next to each other.

* * * * *